United States Patent [19]
Brigati et al.

[11] Patent Number: 5,796,297
[45] Date of Patent: Aug. 18, 1998

[54] SELECTOR SWITCH CIRCUIT ENABLING THE SELECTIVE SUPPLY OF VOLTAGES WITH DIFFERENT SIGNS

[75] Inventors: Alessandro Brigati, Aix en Provence; Nicolas Demange, Lessy; Maxence Aulas, St Haon le Vieux; Marc Guedj, Pont Saint Esprit, all of France

[73] Assignee: SGS-Thomson Microelectronics S.A., Saint Genis, France

[21] Appl. No.: 666,733

[22] Filed: Jun. 17, 1996

[30] Foreign Application Priority Data

Jun. 21, 1995 [FR] France ................... 95 07620

[51] Int. Cl.⁶ ............................................. H03K 17/693
[52] U.S. Cl. ..................... 327/546; 327/408; 327/409; 307/80; 307/126; 307/130
[58] Field of Search ......................... 327/407, 408, 327/409, 410, 538, 543, 545, 546; 307/75, 80, 126, 130

[56] References Cited

U.S. PATENT DOCUMENTS

| H1236 | 10/1993 | Schabdach et al. | 102/217 |
|---|---|---|---|
| 3,330,968 | 7/1967 | Loven . | |
| 3,602,738 | 8/1971 | Bohm . | |
| 4,577,149 | 3/1986 | Zbinden | 324/73 |
| 4,698,530 | 10/1987 | Thomson | 327/437 |
| 4,896,297 | 1/1990 | Miyatake et al. | 327/390 |
| 4,945,267 | 7/1990 | Galbraith . | |
| 5,070,255 | 12/1991 | Shin | 327/408 |
| 5,334,881 | 8/1994 | Kirkpatrick . | |
| 5,442,218 | 8/1995 | Seidel et al. | 327/410 |

FOREIGN PATENT DOCUMENTS

A-2 065 404  6/1981  United Kingdom .

OTHER PUBLICATIONS

1992 Data Converter Reference Manual, vol. II, Analog Devices, Aug. 1916 Channel Analog Multiplexers (ADG506A/ADG507A), 7 pages.

1992 Data Converter Reference Manual, vol. II, Analog Devices, 16-Channe/Dual 8-Channel JFET Analog Multiplexers (Overvoltage Protected) (MUX-16/MUX-28), 8 pages.

Primary Examiner—Terry Cunningham
Attorney, Agent, or Firm—Wolf, Greenfield & Sacks, P.C.

[57] ABSTRACT

A selector switch circuit comprises an input terminal to receive a positive voltage, an input terminal to receive a negative voltage, a command input terminal to receive a first command logic signal and an output terminal to provide an output voltage. The output is connected selectively to one of the input terminals, the first and second input terminals being connected to the output terminal by means of a first transistor and a second transistor and the circuit comprising control means for the production, as a function of the command signal, of the control voltages applied to the control gates of the transistors for the selective connection of the output terminal to one of the input terminals.

19 Claims, 3 Drawing Sheets

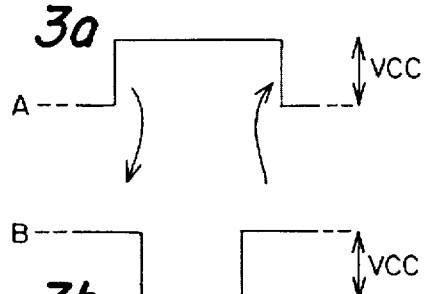
FIG. 3a
FIG. 3b
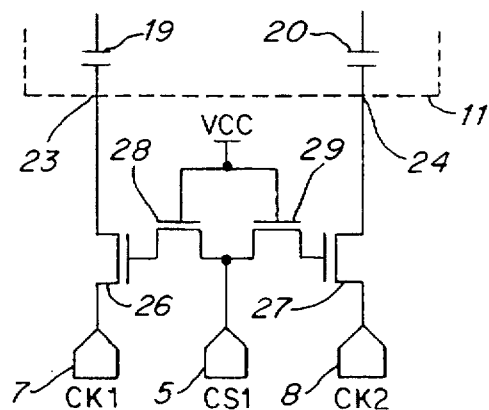
FIG. 4
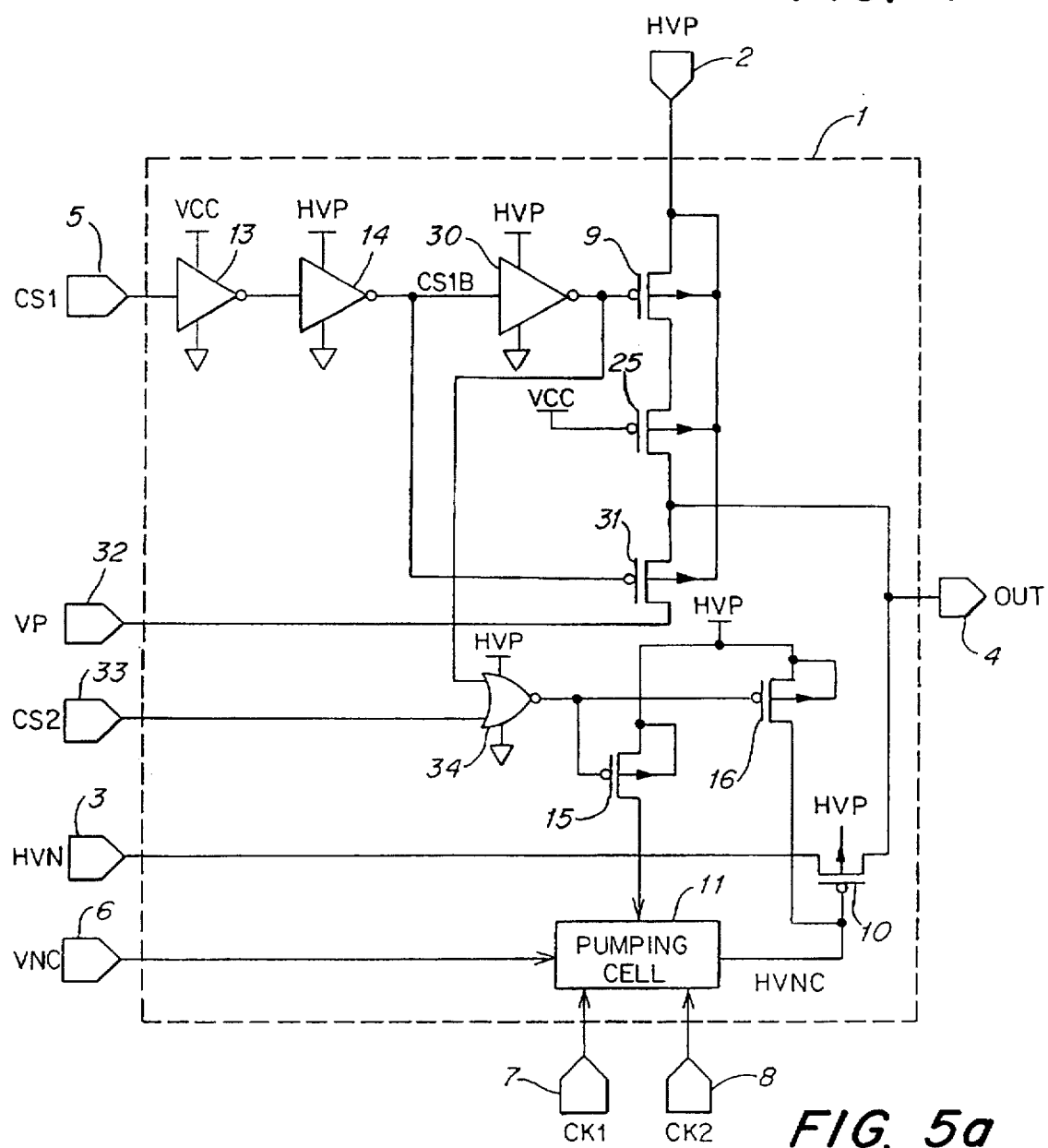
FIG. 5a

5,796,297

1

SELECTOR SWITCH CIRCUIT ENABLING THE SELECTIVE SUPPLY OF VOLTAGES WITH DIFFERENT SIGNS

BACKGROUND OF THE INVENTION

1. Field of the Invention

The invention relates to a selector switch circuit that enables the selective furnishing of voltages with different signs.

2. Discussion of the Related Art

At present, in the field of integrated circuits there is a growing use of supply circuits delivering voltages with opposite signs for the selective supply of one and the same circuit. Thus, for example, the U.S. Pat. No. 5,077,691 describes a flash EEPROM type memory in which the control gates of storage transistors are biased either positively or negatively, with the bias voltages being produced by charge pump type circuits. In this context, in order to reduce the biasing time of the transistors, it is preferable to produce the biasing voltages permanently and use a selector switch circuit to enable a selected supply, at an output, of one of the voltages, while at the same time ensuring insulation between the supply circuits.

SUMMARY OF THE INVENTION

Thus, according to one embodiment, the invention relates to a selector switch circuit comprising a first input terminal to receive a first positive voltage, a second input terminal to receive a negative voltage, a first command input terminal to receive a first command logic signal, an output terminal to provide an output voltage by the selective connection of this output terminal to one of the input terminals, the first and second input terminals being connected to the output terminal by means of a first transistor and a second transistor and control means for the production, as a function of the command signal, of the control voltages applied to the control gates of the transistors for the selective connection of the output terminal to one of the input terminals.

According to another embodiment of the invention, a selector switch circuit includes inputs to receive positive and negative voltages and an output to provide and output voltage selected from among the positive and negative voltages. A transistor is coupled between each of the inputs and the output to establish a conductance between the selected input and the output.

According to another embodiment, positive and negative voltages are received at input nodes. A control signal is received at another input node that identifies a selected voltage from among the positive and negative voltages. Responsive to the control signal, a conductance is established in a transistor coupled between the input node having the selected voltage on it and the output. Thus, the selected voltage is provided at the output.

BRIEF DESCRIPTION OF THE DRAWINGS

Other features and advantages shall appear from the following description, made with reference to the appended drawings of which:

FIGS. 3a and 3b show timing diagrams of piloting signals for a pumping signal used in the invention,

2

Figure 5B:
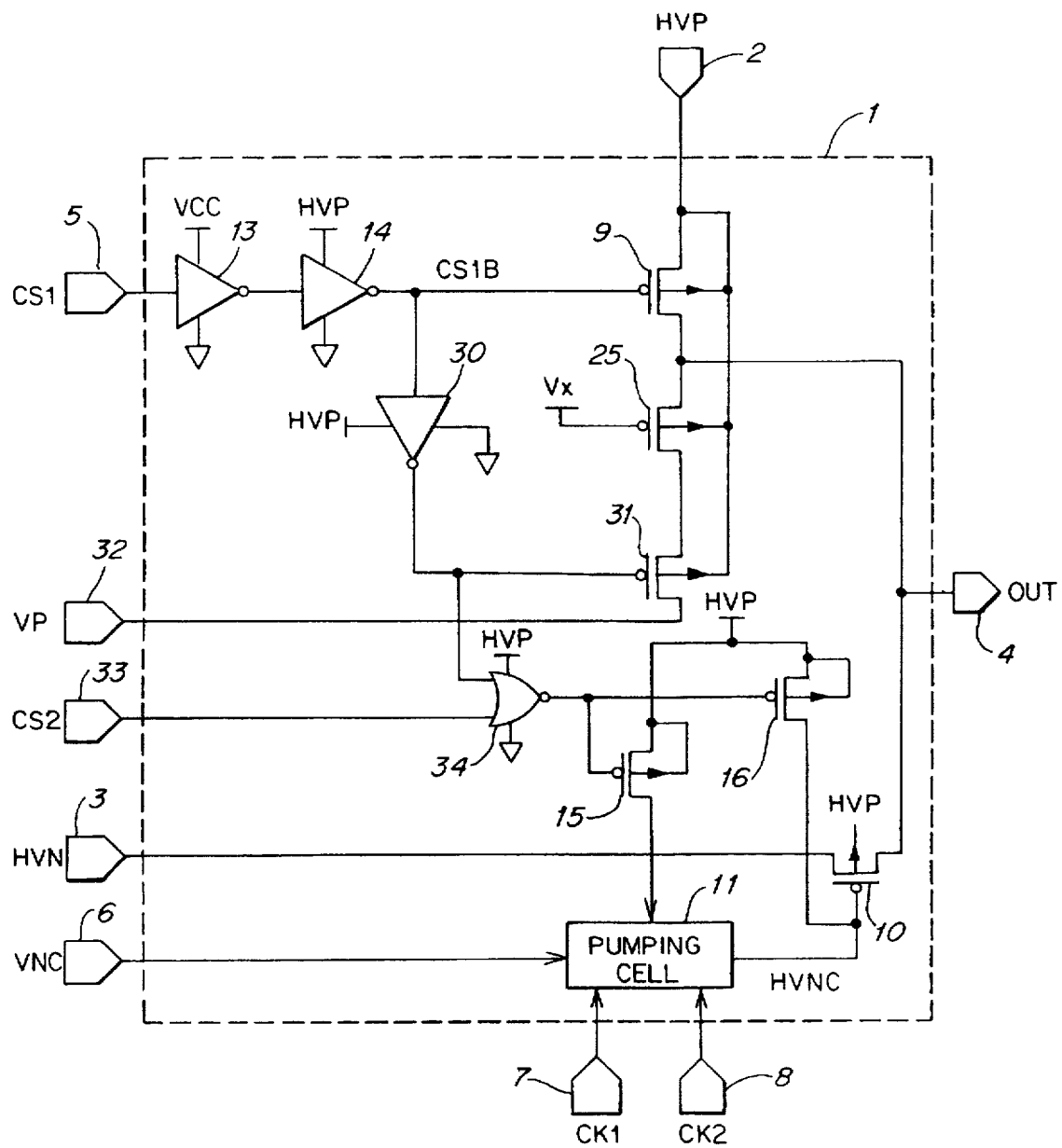

FIG. 4 shows a schematic view of a part of a second circuit according to the invention, FIGS. 5a and 5b show schematic views of different embodiments of a third circuit according to the invention.

DETAILED DESCRIPTION

Figure 1:
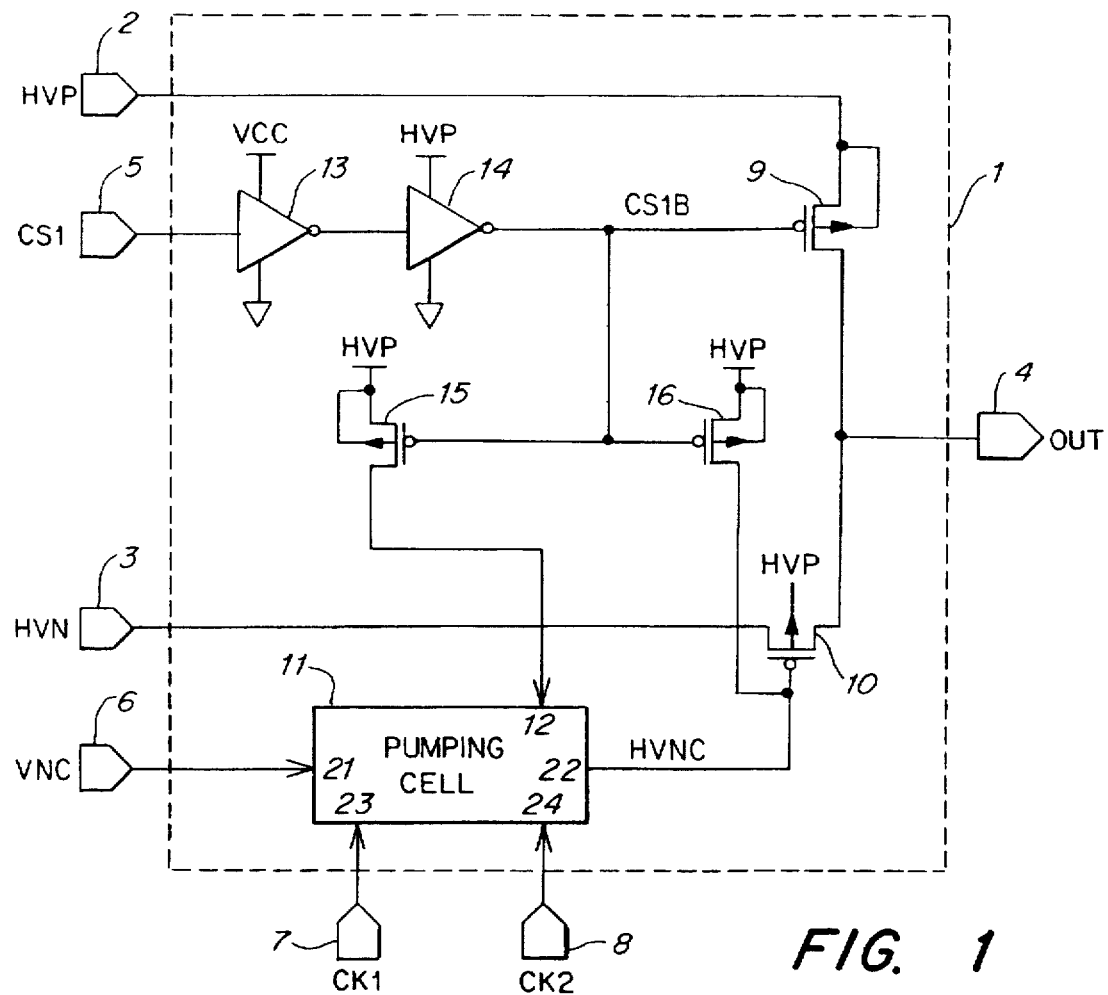
FIG. 1 shows a schematic view of a first circuit according to the invention.

FIG. 1 shows a schematic view of a selector switch circuit 1 made according to the invention. The circuit 1 has:

- a first input terminal 2 to receive a positive voltage HVP produced for example by a charge pump type of voltage generator from a supply voltage VCC.
- a second input terminal 3 to receive a negative voltage HVN, produced, for example, by a charge pump type of voltage generator from the supply voltage VCC.
- an output terminal 4 to provide an output voltage OUT,
- a command input terminal 5 to receive a command logic signal CS1,
- control and insulation means (described below) such that the output terminal 4 is connected to the input terminal 2 when the signal CS1 is in a first state (CS1=0), the output terminal 4 is connected to the input terminal 3 when the signal CS1 is in a second state (CS1=1), and the input terminals 2 and 3 are insulated from each other irrespective of the state of the command signal CS1.

Hereinafter in the description, it shall be assumed that the circuits described are made conventionally by MOS technology using a P-type substrate. The invention could be implemented typically in an integrated circuit but it is quite possible also to make it by means of discrete components.

The input terminal 2 is connected to the output terminal 4 by a P-type transistor 9 whose source is connected to the input terminal 2 and whose drain is connected to the output terminal 4. The control gate of the transistor 9 receives a command signal CS1B so that the transistor 9 is turned on or off depending on the state of the signal CS1B. The state of the signal CS1B depends on the state of the signal CS1. The well of the transistor 9 is connected to its source in order to bias it positively.

The input terminal 3 is connected to the output terminal 4 by a P-type transistor 10 whose source is connected to the input terminal 3 and whose drain is connected to the output terminal 4. The control gate of the transistor 10 receives a command signal HVNC so that this transistor is turned on or off depending on the state of the signal HVNC. The well of the transistor 10 is biased positively, for example, by being connected to the input terminal 2.

Assuming that the voltage HVP is greater than VCC, the signal CS1B is produced from a voltage step-up circuit formed, for example, by two invertors 13 and 14 that are series-connected between the command input terminal 5 and the control gate of the transistor 9. The first inverter 13 is supplied between the supply voltage VCC and a ground, and the second inverter 14 is supplied between the voltage HVP and the ground. Thus, if CS1 is at VCC (CS1=1), then CS1B will be equal to HVP (CS1B=1) and OUT will be equal to HVN. If CS1 is at 0 volts (CS1=0), then CS1B will be at 0 volts (CS1B=0) and OUT will be equal to HVP. Of course, it is possible to do without the invertors 13 and 14 if HVP≦VCC. It should be noted that the voltage HVP could be variable. Thus, it is quite possible to have HVP>VCC (when CS1=0) and HVP<VCC (when CS1=1).

The signal HVNC is produced from a pumping cell 11 described below, that receives a negative voltage VNC at an input terminal 6 of the circuit 1 and produces, from this negative voltage VNC, the voltage HVNC so that HVNC has an absolute value greater than that of HVN. The input terminal 6 could be the same as the input terminal 3. in which case, VNC=HVN.

Figure 2:
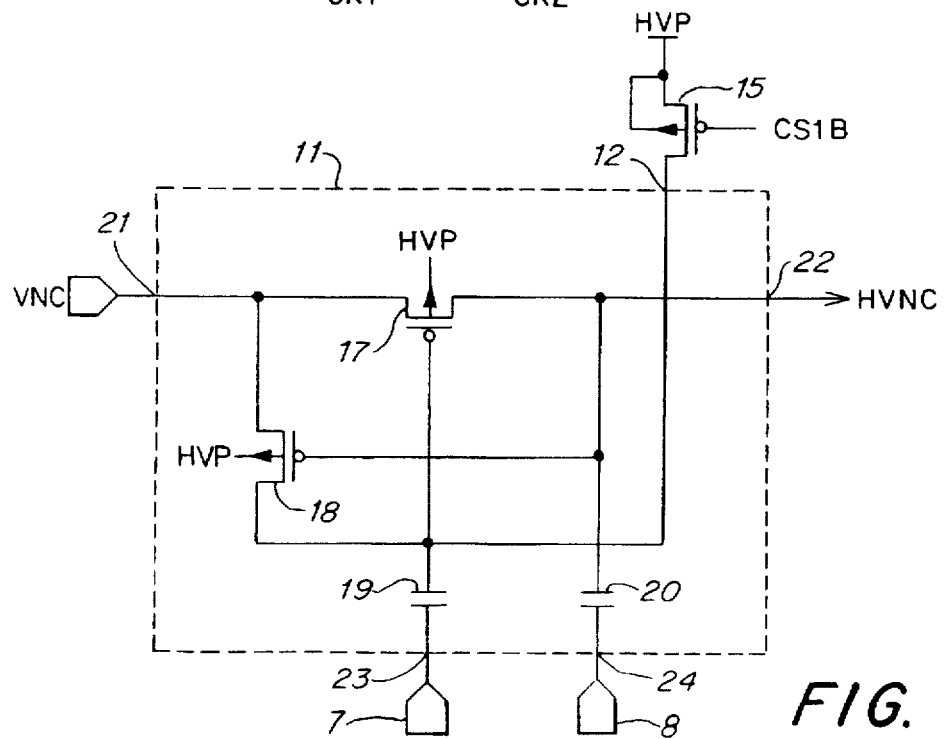
FIG. 2 shows a schematic view of a pump cell used in the invention.

The pumping cell 11. shown in FIG. 2. comprises:

an input 21 to receive the voltage VNC.

an output 22 to supply the voltage HVNC. and two inputs 23 and 24 to receive clock signals CK1 and CK2. which are received at the input terminals 7 and 8 of the circuit 1.

The cell 11 shown in FIG. 2 has:

a first P-type transistor 17 having its source connected to the input terminal 21 and its drain connected to the output 22.

a second P-type transistor 18 having its drain connected to the input 21. its source connected to the control gate of the first transistor 17 and its control gate connected to the output 22.

a first capacitor 19 having a first pole connected to the control gate of the transistor 17 and its second pole connected to the input 23.

a second capacitor 20 having a first pole connected to the output 22 and its second pole connected to the input 24.

In practice, the capacitors 19 and 20 will be formed, for example, by means of P-type transistors, the first pole of these capacitors corresponding to a control gate and the second pole corresponding to a drain and a source connected to each other. The first pole of the capacitor 19 is connected to an input 12 of the cell 11.

The signals CK1 and CK2 will be, for example, the signals A and B illustrated in FIGS. 3a and 3b, respectively. These signals switch between VCC and 0 volts.

Assuming that signal A is initially at 0 and that signal B is initially at VCC, signals A and B are such that:

the buildup to VCC of signal A leads to the descent to 0 of signal B.

the buildup to VCC of signal B leads to the descent to 0 of signal A. with signal A rising subsequently to VCC and this pattern repeating continuously.

In the cell 11. negative charges are transferred from the input 21 to the capacitor 20 on a trailing edge of signal A. the transistor 17 then being turned on. On a leading edge of signal A. the transistor 17 is turned off. On a trailing edge of signal B. the output voltage HVNC increases in absolute value by the value of VCC.

The wells of the P-type transistors of the pumping cell 11 are biased positively. They are, for example, connected by conductive means that are not shown (for example, a conductive line formed from a metal layer of the circuit) to the input terminal 2 to receive the voltage HVP.

The circuit 1 has two P-type transistors 15 and 16. the sources and wells of which are connected to the input terminal 2 and the control gates of which receive the signal CS1B. These transistors function to insulate the input terminals 3 and 6 from the output terminal 4 when it is desired to provide the positive voltage HVP at the output terminal 4 (i.e., when CS1=0). The drain of the transistor 15 is connected to the input 12 of the cell 11. The drain of the transistor 16 is connected to the control gate of the transistor 10. When CS1B=0. the transistors 10 and 17 are turned off through the imposition of a positive voltage (HVP in the example described) at their control gates. The result, then, is that OUT=HVP. The converse is also true, that is, when CS1B=1. OUT=HVN. Terminals 2 and 4 then are insulated from each other by the transistor 9 whose control gate is at a potential greater than or equal to the potentials present at its drain and source.

FIG. 4 shows a schematic view of a part of a second selector switch circuit made according to the invention. In addition to the elements described with reference to FIG. 1 and not shown in FIG. 4. there are provided means enabling the insulation of the inputs 23 and 24 from the cell 11 of the input terminals 7 and 8 of the circuit when CS1=0 (i.e., when OUT=HVP).

In FIG. 4. an N-type insulation transistor 26 is interposed between the input terminal 7 of the circuit and the input 23 of the cell 11. This insulation transistor 26 has its drain connected to the input 23 and its source connected to the input terminal 7. The control gate of the insulation transistor 26 is connected to the command input terminal 5 by means of a transistor 28 having its control gate biased at VCC. its source connected to the input terminal 5 and its drain connected to the control gate of the transistor 26.

Between the input terminal 8 of the circuit and the input 24 of the cell 11. there is interposed an N-type insulation transistor 27. This insulation transistor 27 has its drain connected to the input 24 and its source connected to the input terminal 8. The control gate of the insulation transistor 27 is connected to the command input terminal 5 by means of a transistor 29 having its control gate biased at VCC. its source connected to the input terminal 5 and its drain connected to the control gate of the transistor 27.

The assembly described with reference to FIG. 4 enables the insulation of the two poles of the capacitors 19 and 20 from the input terminals 7 and 8 when the selector switch circuit is activated so that it provides the voltage HVP at the output terminal 4. This assembly has several advantages. It makes it possible to prevent the disturbing (by pumping) of the positive voltage applied to the control gates of the transistors 10 and 17 by insulating the input terminals 3 and 6 from the output terminal 4. This is preferable if this positive voltage is the voltage HVP. It is possible to arrive at the same result by keeping the signals CK1 and CK2 in a constant state during the period of time that HVN has not been selected as the output voltage. This approach can be envisaged if these signals are produced with the sole purpose of setting the rate of operation of a cell 11 of a single selector switch circuit. If it is desired, for example, to use two selector switch circuits in such a way that a positive voltage is provided at the output terminal of one of the circuits and a negative voltage at the output terminal of the other circuit, however, it would not be possible to use identical rate-setting signals to set the rate of the operation of their pumping cells. Therefore, the cells used to produce these signals would have to be duplicated, raising a problem due to the additional space requirement. The assembly shown in FIG. 4 has the advantage, according to the assumption presented above, of enabling the use of identical rate-setting signals. It is thus possible to produce the signals shown in FIGS. 3a and 3b repetitively, independently of the voltages to be provided at the output terminals of the selector switch circuits, without disturbing the voltage HVP.

FIG. 5a shows a selector switch circuit according to the invention in which it is planned to selectively provide a third positive voltage VP, which is lower than HVP. at the output terminal 4.

In the circuit shown in FIG. 5a. in addition to the elements shown in FIG. 4 (and bearing identical references), the circuit 1 has a P-type transistor 31. This transistor 31 has its drain connected to the output terminal 4. Its source is connected to an input terminal 32 receiving a positive voltage VP. Its control gate is connected to the output of the inverter 14. Finally, an inverter 30 is interposed between the output of the inverter 14 and the control gate of the transistor 9. Furthermore, the drain of this transistor 9 is connected to the output terminal 4 by means of a P-type insulation transistor 25. The source of the transistor 25 is connected to the drain of the transistor 9 and its drain is connected to the output terminal 4. The wells of the transistors 25 and 31 are biased positively, for example by being connected to the source of the transistor 9. The control gate of the transistor 25 is biased positively at a positive voltage below HVP.

Finally, the circuit of FIG. 5a has a NOR logic gate 34. This gate 34, supplied between the voltage HVP and the ground, receives the inverted (i.e., complementary) signal of CS1B at a first input (this signal being presented at output of the inverter 30). It has a second input connected to an input terminal 33 of the circuit, this input terminal 33 receiving a command logic signal CS2. Its output is connected to the control gates of the transistors 15 and 16. The transistors 15 and 16, therefore, are no longer controlled directly by the inverter 14.

In the assembly shown in FIG. 5a, the output terminal 4 is connected to:

the input terminal 3 if CS1 is at VCC (CS1=1) and CS2 is at 0 volts (CS2=0), the input terminal 2 if CS1 and CS2 are at VCC (CS2= CS1=1), the input terminal 32 if CS1 is at 0 volts (CS1=0) and if CS2 is at VCC (CS2=1).

In the former case (OUT=HVN), the transistors 15 and 16 are turned off. This enables the connection of the terminals 3 and 4. The transistor 31 is turned off. This insulates the input terminal 32 from the rest of the circuit. Finally, the transistor 9 is turned on but the transistor 25 is turned off. This insulates the input terminal 2 from the output terminal 4. As shown in FIG. 5b, it also in possible to place the transistor 25 between the output terminal 4 and the transistor 31, the control gate of the latter transistor then being connected to the output of the inverter 30 and the control gate of the transistor 9 being connected to the output of the inverter 14. In this case, for OUT=HVN, the input terminal 2 is insulated by turning the transistor 9 off and the input terminal 32 is insulated with the transistor 25. Care should be taken, in this configuration, to bias the control gate of the transistor 25 at a voltage below Vx that is VP (which requires the production of an additional voltage).

In the other cases (i.e., where OUT is different from HVN), the transistors 15 and 16 are turned on and the input terminal 3 is insulated from the rest of the circuit.

In the second case (i.e., where OUT=HVP), the transistor 31 insulates the input terminal 32 from the rest of the circuit (or the input terminal 2 from the rest of the circuit if the transistor 25 is placed between the output terminal 4 and the input terminal 32, OUT then being equal to VP).

In the latter case, (i.e., where OUT=VP), the input terminal 2 (or the input terminal 32, if OUT=HVP) is insulated from the output terminal 4, the transistor 9 (or the transistor 31) being turned off.

Naturally, the invertors 13 and 14 will not be used if HVP≦VCC. In this case, the control gate of the insulation transistor 25 will not receive the voltage VCC as shown in FIG. 5a, but will receive a different voltage lower than HVP (and greater than VP). It should be observed that the voltage HVP could be variable. It is quite possible to have HVP>VCC (when CS1=0) and HVP<VCC (when CS1=1).

The circuits illustrated in FIGS. 5a and 5b are valuable especially for biasing control gates of floating gate transistors of flash EEPROM type memories, as such memories tend to impose high positive or negative voltages on these gates during erasure and writing operations, and a low positive voltage during read operations.

Although this has not been shown in FIGS. 5a and 5b, it is of course possible and advantageous to modify the circuits shown in FIGS. 5a and 5b in accordance with the description made with reference to FIG. 4.

Having thus described at least one illustrative embodiment of the invention, various alterations, modifications and improvements will readily occur to those skilled in the art. Such alterations, modifications and improvements are intended to be within the spirit and scope of the invention.

Accordingly, the foregoing description is by way of example only and is not intended as limiting.

The invention is limited only as defined in the following claims and the equivalents thereto.

What is claimed is:

1. A selector switch circuit comprising:

a first input terminal to receive a first positive voltage, a second input terminal to receive a negative voltage, a third input terminal to receive a second positive voltage, command input terminals to receive command logic signals, an output terminal to provide an output voltage by selectively connecting the output terminal to one of the first input terminal, the second input terminal and the third input terminal, the first input terminal being connected to the output terminal via a first transistor, the second input terminal being connected to the output terminal via a second transistor, and the third input terminal being connected to the output terminal via a third transistor, control means for producing, as a function of the command logic signals, control voltages applied to the control electrodes of the first, second and third transistors to selectively connect the output terminal to one of the first, second and third input terminals, and an insulation transistor to insulate one of the first and third transistors from the output terminal when the output terminal is connected to the second input terminal.

2. The circuit as claimed in claim 1, wherein the control means includes means for applying control voltages to the control electrodes of the first and third transistors such that when the first transistor is turned on, the third transistor is turned off, and when the third transistor is turned on, the first transistor is turned off.

3. A selector switch circuit, comprising:

a first input terminal to receive a positive voltage, a second input terminal to receive a negative voltage, a command input terminal to receive a command logic signal, an output terminal to provide an output voltage by selectively connecting the output terminal to one of the first and second input terminals, the first input terminal being connected to the output terminal via a first transistor and the second input terminal being connected to the output terminal via a second transistor, and control means for producing, as a function of the command logic signal, control voltages applied to control electrodes of the first and second transistors to selectively connect the output terminal to one of the first and second input terminals, the control means including a pumping cell coupled to the control electrode of the second transistor so that the control voltage applied to the control electrode of the second transistor is produced by the pumping cell.

4. A circuit according to claim 3, wherein the control means further includes a voltage step-up circuit coupled to the control electrode of the first transistor so that the control voltage applied to the control electrode of the first transistor is produced by the voltage step-up circuit.

5. The circuit according to claim 3, wherein the pumping cell is coupled to third and fourth input terminals to receive clock signals therefrom that control a rate of operation of the pumping cell.

6. A circuit according to claim, further comprising means for insulating the pumping cell from the fourth and fifth input terminals when the second transistor is turned off.

7. A selector switch circuit, comprising:

a first input terminal to receive a positive voltage, a second input terminal to receive a negative voltage, a command input terminal to receive a command logic signal, an output terminal to provide an output voltage by selectively connecting the output terminal to one of the first and second input terminals, the first input terminal being connected to the output terminal via a first transistor and the second input terminal being connected to the output terminal via a second transistor, and control means for producing, as a function of the command logic signal, control voltages applied to control electrodes of the transistors to selectively connect the output terminal to one of the first and second input terminals, the control means including means for positively biasing the control electrode of the second transistor when the first transistor is turned on.

8. A selector switch circuit, comprising:

a first input terminal to receive a first positive voltage, a second input terminal to receive a negative voltage, a third input terminal to receive a second positive voltage, command input terminals to receive command logic signals, an output terminal to provide an output voltage by selectively connecting the output terminal to one of the first, second and third input terminals, the first input terminal being connected to the output terminal via a first transistor, the second input terminal being connected to the output terminal via a second transistor, and the third input terminal being connected to the output terminal via a third transistor, and control means for producing, as a function of the command logic signals, control voltages applied to control gates of the first, second and third transistors to selectively connect the output terminal to one of the first, second and third input terminals, the control means including means for positively biasing the control electrode of the second transistor when the third transistor is turned on.

9. A selector switch circuit, comprising:

a first input arranged to receive a positive input voltage;

a second input arranged to receive a negative input voltage;

a third input arranged to receive a third input voltage;

control inputs arranged to receive control signals;

an output arranged to provide a selected output voltage;

a first transistor coupled between the first input and the output, the first transistor being arranged to alter a conductance between the first input and the output in reference to the control signals;

a second transistor coupled between the second input and the output, the second transistor being arranged to alter a conductance between the first input and the output in reference to the control signals;

a third transistor coupled between the third input and the output, the third transistor being arranged to alter a conductance between the third input and the output in reference to the control signals; and an insulating transistor coupled between one of the first and third transistors and the output to insulate the one of the first and third transistors from the output when the negative input voltage is present at the output.

10. The circuit as claimed in claim 9, further comprising a control circuit coupled between the control inputs and the first, second and third transistors, the control circuit providing first, second and third control voltages, based upon the control signals, to control the conductances of the first, second and third transistors.

11. A selector switch circuit, comprising:

a first input arranged to receive a positive input voltage;

a second input arranged to receive a negative input voltage;

a control input arranged to receive a control signal;

an output arranged to provide a selected output voltage;

a first transistor coupled between the first input and the output, the first transistor being arranged to alter a conductance between the first input and the output in reference to the control signal;

a second transistor coupled between the second input and the output, the second transistor being arranged to alter a conductance between the second input and the output in reference to the control signal; and a pumping cell coupled to the second transistor so as to control the conductance of the second transistor.

12. The circuit as claimed in claim 11, further comprising a control circuit coupled between the control input and the first and second transistors, the control circuit providing control voltages, based upon the control signal, to the first and second transistors to control the conductances of the first and second transistors.

13. The circuit as claimed in claim 11, wherein the pumping cell is coupled to at least one clock input node to receive at least one clock signal that controls the pumping cell's rate of operation.

14. The circuit as claimed in claim 13, wherein the at least one clock input node includes a pair of clock input nodes to receive a pair of clock signals that control the pumping cell's rate of operation.

15. The circuit as claimed in claim 11, further comprising a voltage step-up circuit arranged to step up a voltage applied to a control electrode of the first transistor.

16. The circuit as claimed in claim 15, wherein the voltage step-up circuit is arranged to step-up the voltage applied to the control electrode of the first transistor to a level sufficient to turn off the first transistor.

17. A method for switchably providing one of a positive voltage and negative voltage at an output node, comprising the steps of:

receiving the positive voltage and the negative voltage on first and second respective input nodes;

receiving a control signal that selects one of the positive voltage and the negative voltage;

generating a voltage that is negative and greater in absolute value than the negative voltage; and responsive to the control signal, establishing a conductance between one of the first and second input nodes and the output node and de-establishing a conductance between the other of the first and second input nodes and the output node, wherein the voltage that is negative and greater in absolute value than the negative voltage is used to selectively establish the conductance between the second input node and the output node.

18. The method of claim 17, wherein the step of establishing a conductance between the one of the first and second input nodes and the output node and de-establishing a conductance between the other of the first and second output nodes includes the steps of:

responsive to the control signal, generating an adjusted control voltage having a high-state that attains a greater amplitude than a high-state of the control signal;

responsive to the adjusted control voltage, selectively establishing a conductance between the first input node and the output node.

19. The method of claim 17, wherein the step of establishing a conductance between one of the first and second input nodes and the output node and de-establishing a conductance between the other of the first and second input nodes and the output node includes the step of selectively establishing a conductance between the second input node and the output node by applying the voltage that is negative and greater in absolute value than the negative voltage to a control electrode of a transistor having a first current electrode coupled to the second input node and a second current electrode coupled to the output node.

* * * * *